United States Patent
Chakraborty (10) Patent No.: US 9,618,579 B2
(45) Date of Patent: Apr. 11, 2017

(54) PROGRAMMABLE CIRCUITS FOR CORRECTING SCAN-TEST CIRCUITRY DEFECTS IN INTEGRATED CIRCUIT DESIGNS

(71) Applicant: Lattice Semiconductor Corporation, Hillsboro, OR (US)

(72) Inventor: Kanad Chakraborty, Portland, OR (US)

(73) Assignee: Lattice Semiconductor Corporation, Hillsboro, OR (US)

( * ) Notice: Subject to any disclaimer, the term of this patent is extended or adjusted under 35 U.S.C. 154(b) by 28 days.

(21) Appl. No.: 14/697,702

(22) Filed: Apr. 28, 2015

(65) Prior Publication Data

US 2016/0320448 A1   Nov. 3, 2016

(51) Int. Cl.
| | | |
|---|---|---|
| *G06F 11/22* | (2006.01) | |
| *G06F 17/50* | (2006.01) | |
| *G01R 31/3177* | (2006.01) | |
| *G01R 31/317* | (2006.01) | |

(52) U.S. Cl.
CPC ..... *G01R 31/3177* (2013.01); *G01R 31/3172* (2013.01)

(58) Field of Classification Search
USPC .................. 320/106, 108, 111, 113, 134, 136
See application file for complete search history.

(56) References Cited

U.S. PATENT DOCUMENTS

| | | | | |
|---|---|---|---|---|
| 5,878,055 A | * | 3/1999 | Allen | G01R 31/2882 714/744 |
| 6,184,707 B1 | * | 2/2001 | Norman | H03K 19/17728 326/38 |
| 8,311,762 B1 | * | 11/2012 | Hartanto | G01R 31/31851 702/117 |
| 8,866,527 B1 | * | 10/2014 | Lewis | H03K 3/012 327/202 |
| 2003/0233221 A1 | * | 12/2003 | O'Brien | G06F 11/261 703/23 |
| 2009/0113263 A1 | * | 4/2009 | Cannon | G01R 31/31853 714/726 |
| 2014/0298123 A1 | * | 10/2014 | Tekumalla | G06F 11/2215 714/726 |

* cited by examiner

*Primary Examiner* — Brian Ngo
(74) *Attorney, Agent, or Firm* — Haynes and Boone, LLP (57) ABSTRACT

In certain embodiments, an integrated circuit has scan-test circuitry that performs scan testing on circuitry under scan test (CUST) within the IC, where the scan-test circuitry is susceptible to a defect. In order to enable the defect to be corrected after it occurs, the scan-test circuitry includes a set of programmable circuitry connected to provide a signal to other circuitry (e.g., a scan chain) within the scan-test circuitry, where the set of programmable circuitry includes one or more configurable memory cells connected to control the programming of the set of programmable circuitry. The memory cell(s) can be configured to program the set of programmable circuitry to enable the scan testing to be performed without modification. The memory cell(s) can also be configured to program the set of programmable circuitry to modify the scan testing to correct the defect in the scan-test circuitry.

16 Claims, 7 Drawing Sheets

PROGRAMMABLE CIRCUITS FOR CORRECTING SCAN-TEST CIRCUITRY DEFECTS IN INTEGRATED CIRCUIT DESIGNS

BACKGROUND

Field of the Invention

The present invention relates to electronics and, more specifically but not exclusively, to integrated circuits having defects in their scan-test circuitry, including, but not limited to, scan-chain defects.

Description of the Related Art

This section introduces aspects that may help facilitate a better understanding of the invention. Accordingly, the statements of this section are to be read in this light and are not to be understood as admissions about what is prior art or what is not prior art.

It is well known to design an integrated circuit (IC), such as (without limitation) a field-programmable gate array (FPGA), with scan-test circuitry that supports scan testing of the integrated circuitry to detect defects in the functionality of that integrated circuitry. Scan testing typically involves synthesizing scan chains in hard logic blocks embedded in the integrated circuit by replacing regular flip-flop cells with scan flip-flops and then stitching them together into one or more scan chains. A scan chain is a sequence of interconnected scan flip-flops that enables an input data pattern to be shifted into and applied to integrated circuitry under scan testing (also known as CUST) consisting of combinational and sequential logic, where the resulting data generated by the CUST is shifted out by the scan chain to determine whether the CUST is functioning properly, e.g., by comparing the resulting data to an expected set of data. Note that, since the scan flip-flops of a scan chain typically support both scan-test functionality as well as normal data-processing functionality of the integrated circuit, scan chains are typically considered to be part of the CUST.

Figure 1:
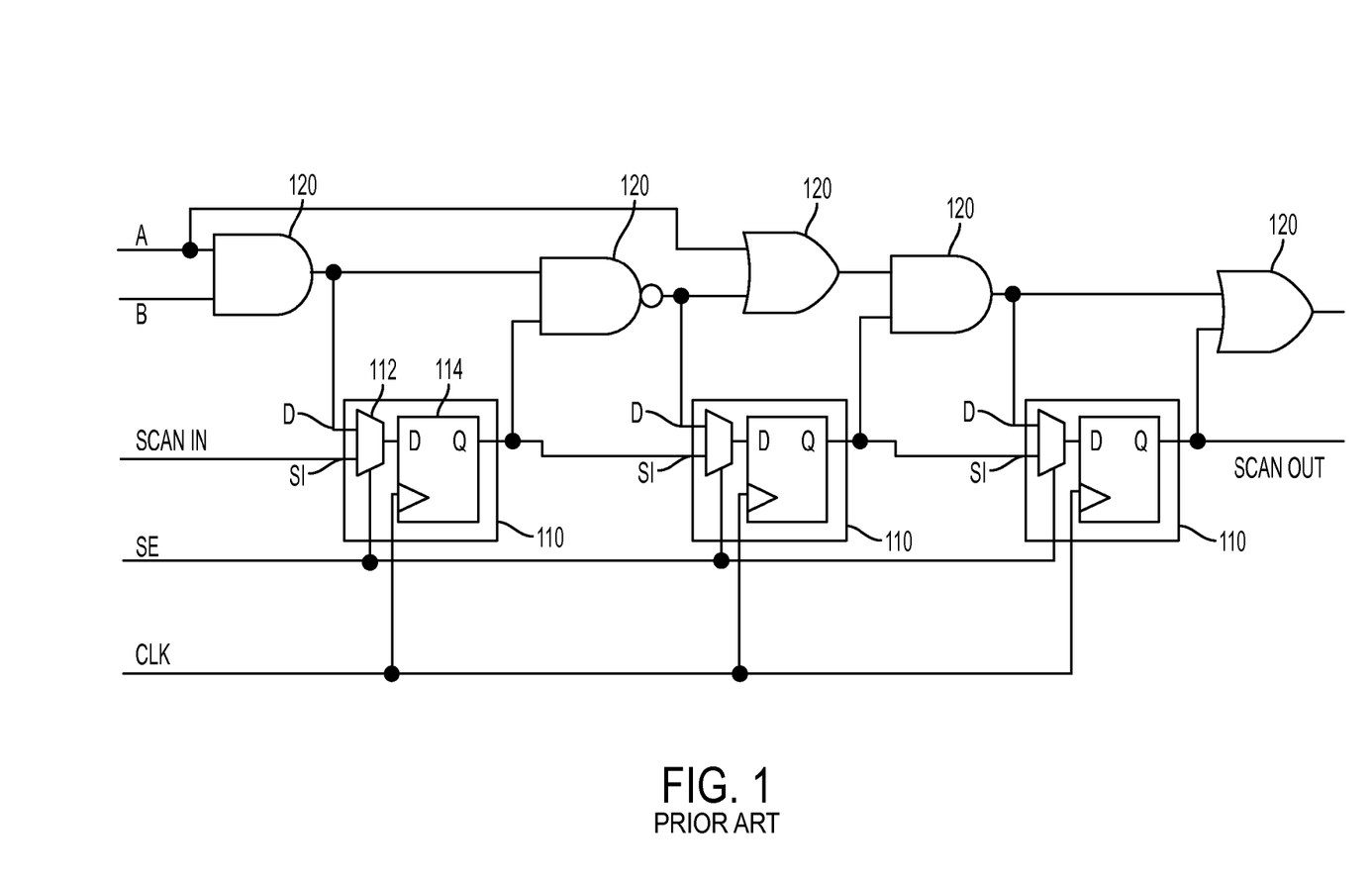
FIG. 1 is a simplified block diagram of a portion of an exemplary scan chain used to support scan testing of a block of combinational logic.

FIG. 1 is a simplified block diagram of a portion of an exemplary scan chain used to support scan testing of a block of combinational logic. In particular, FIG. 1 shows three scan flip-flops 110 variously connected to five interconnected logic gates 120. A typical scan chain will have many more analogously connected scan flip-flops. Each intermediate scan flip-flop 110 along the scan chain has a (2×1) multiplexer (mux) 112 and a flip-flop (FF) cell 114, where one mux input is connected to receive the output of one of the CUST logic gates 120 at the Q input node of the scan flip-flop 110, the other mux input is connected to receive the data output Q of the previous scan flip-flop 110 at the SI input node of the present scan flip-flop 110, and the multiplexer output is connected to the data input port D of the FF cell 114 of the present scan flip-flop 110. Each scan flip-flop 110 also receives a scan-enable control signal SE that controls the selection made by the mux 112 and a clock signal CLK that controls the operation of the FF cell 114, e.g., shifting data applied at the cell's data input port D to the cell's data output port Q at every rising and/or falling edge of the clock signal CLK. In addition to being connected to the SI input node of the next scan flip-flop 110, the data output port Q of the FF cell 114, which is also the data output node Q of the present scan flip-flop 110, is also connected to an input of the one of the CUST logic gates 120.

Scan testing of the CUST may be performed as follows. When the scan enable signal SE is set to select data appearing at the SI input ports of the scan flip-flops 110, a scan-test pattern can be sequentially clocked into the scan chain. After the scan-test pattern has been completely clocked into the scan chain, such that each scan flip-flop 110 stores a different bit of the scan-test pattern, the scan enable signal SE can be reset to select the resulting CUST data appearing at the D input ports of the scan flip-flops. At this point, each scan flip-flop 110 stores a different bit of the resulting CUST data pattern. The scan enable signal SE can again be set to select the data appearing at the SI input ports to sequentially read the resulting CUST data pattern out from the scan chain for comparison with the expected CUST data pattern to identify potential CUST defects, and to simultaneously shift in the next scan test pattern (if any) bit-by-bit into the scan chain.

After the scan chains are synthesized, an automatic test pattern generator (ATPG) tool is employed to analyze the circuit and compute the test vectors needed to achieve high coverage. Shift patterns containing these test vectors are serially shifted through the scan chains into the CUST, and the CUST responses to these patterns are captured and shifted out through the scan chains and analyzed by the ATPG tool. Sometimes, the coverage achieved with this targeted structural test approach is close to 100% if the RTL (register-transfer level) for the CUST has been well designed, passes all scan design rules, and achieves functional and scan-mode timing closure verified via static timing analysis after the backend design (consisting of logic synthesis, place-and-route).

Therefore, even after all scan design rules for assuring high coverage are obeyed during front-end logic design, scan chains can be successful at achieving high coverage only if (a) the scan chains do not have timing problems after backend design (such as hold-time problems during shift due to not achieving timing closure in scan-test mode, or hold-time problems due to lockup latches with the wrong polarity) and (b) all auxiliary, constrained signals needed for scan testing of a logic block and generated by other logic blocks or from top-level signal hookups after chip integration are in their expected states. Sometimes, it is highly challenging to meet these requirements (particularly on designs with multiple functional clock domains) due to the design complexity, design revisions late in the design cycle, and the time-to-market pressure.

Although a scan chain is designed to support scan testing to determine whether there are any defects in the CUST, the fact is that there may be defects in the scan chain itself. There are a number of different types of scan-chain defects that can occur along a scan chain.

Figure 2:
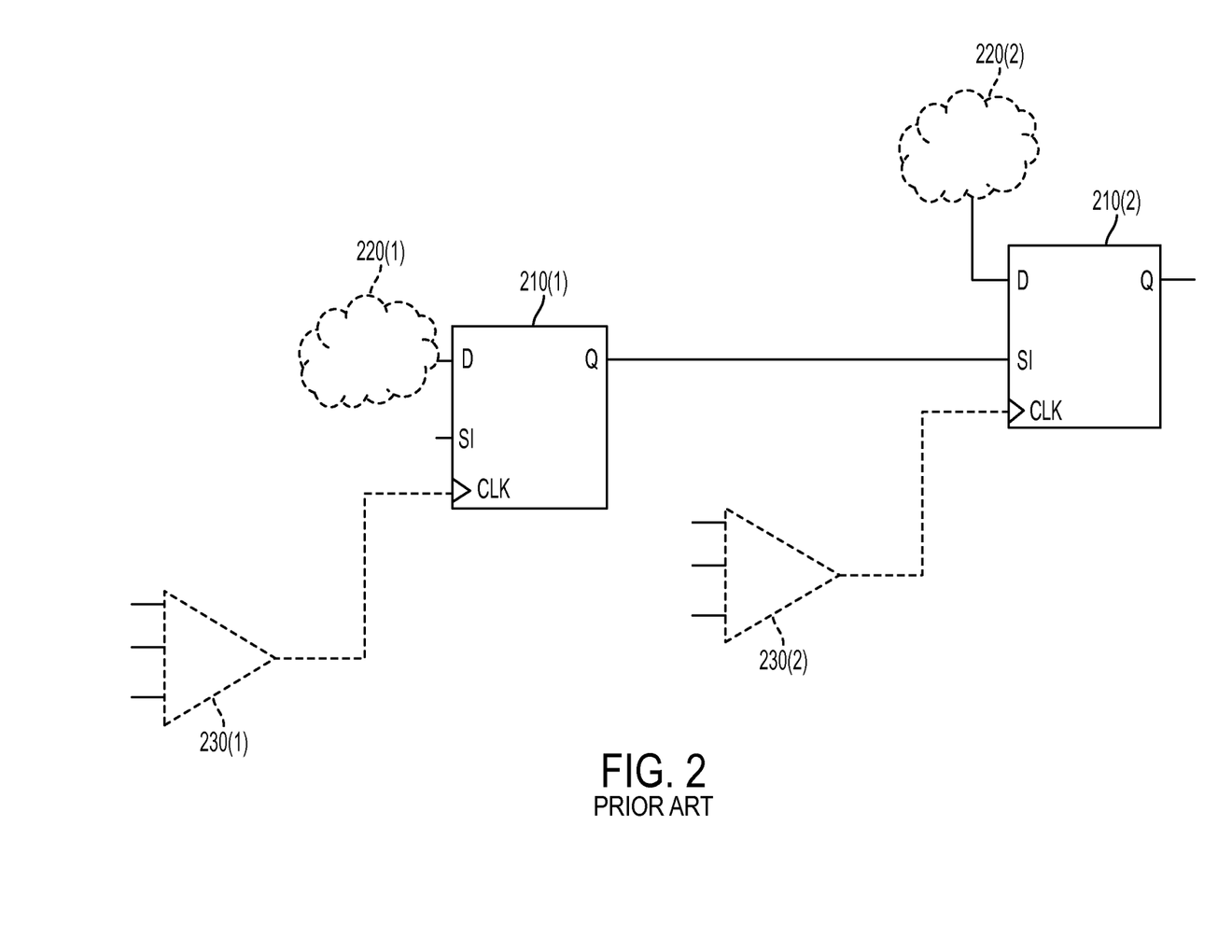
FIG. 2 is a simplified block diagram of a portion of a scan chain that is susceptible to a particular type of scan-chain defect known as a hold-time violation.

FIG. 2 is a simplified block diagram of a portion of a scan chain that is susceptible to a particular type of scan-chain defect known as a hold-time violation. FIG. 2 shows two sequential scan flip-flops 210(1) and 210(2) that are analogous to the scan flip-flops 110 of FIG. 1, where the D input node of each scan flip-flop 210 is connected to the output of a different set of functional logic 220 and the Q output node of the first (aka launch) scan flip-flop 210(1) is connected to the SI input node of the second (aka capture) scan flip-flop 210(2).

As shown in FIG. 2, the clock signal applied to the CLK input node of the first scan flip-flop 210(1) is routed via a first clock-distribution network 230(1), while the clock signal applied to the CLK input node of the second scan flip-flop 210(2) is routed via a second clock-distribution network 230(2). Although, during scan testing, the same scan-test clock is selected for both scan flip-flops 210, because that scan-test clock is routed via two different clock-distribution networks 230(1) and 230(2), there may be timing skew between the two versions of that scan-test clock applied to the two scan flip-flops 210. Such timing skew may result due to incorrect timing constraints used during static timing analysis or by the failure of the place-and-route tool to close timing with the correct timing constraints. If the clock signal applied to the first scan flip-flop 210(1) arrives too early, e.g., before the clock signal is applied to the second scan flip-flop 210(2), then the new Q data output signal from the first scan flip-flop 210(1) may appear at the SI data input node of the second scan flip-flop 210(2) before the existing Q data from the first scan flip-flop 210(1) received at the SI data input node of the second scan flip-flop 210(2) has been correctly processed by second scan flip-flop 210(2) and shifted to its output. In other words, the data output from the first scan flip-flop 210(1) is appearing too soon at the SI data input of the second scan flip-flop 210(2) and erasing the data that should have been processed by the second scan flip-flop 210(2). In that case, a hold-time violation will occur which may result in a loss of data.

When such a hold-time violation is detected during the design of an integrated circuit, the design of the integrated circuit is modified to ensure that the hold-time violation does not occur. This design modification may involve making mask revisions, which typically requires a backend design engineer to successfully close timing in scan-test mode and correct all the other design problems that cause scan-test problems, and is therefore very time consuming and costly in terms of non-recurring engineering (NRE) resources and mask costs. Even if this problem is detected before chip manufacture (thereby avoiding costly mask revisions), the time-to-market pressure makes it highly challenging and expensive to correct timing and logical problems that occur in scan-test mode due to late design revisions.

Figure 3:
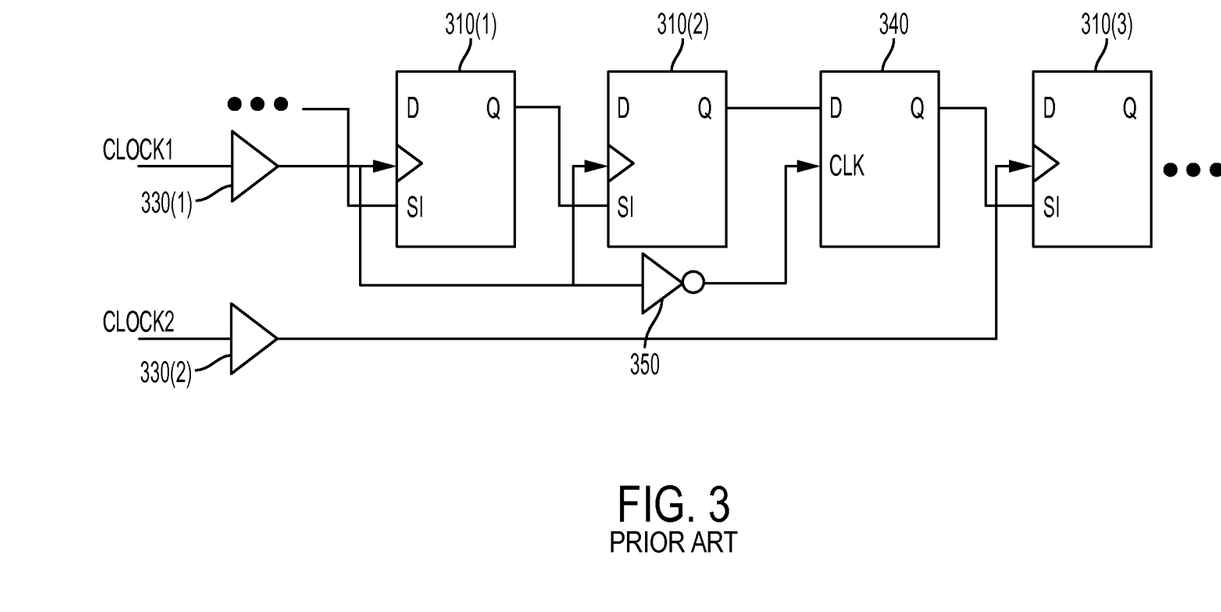
FIG. 3 is a simplified block diagram of a portion of a scan chain that is susceptible to a second type of scan-chain defect known as polarity reversal, in which a signal of the wrong polarity is applied within a scan chain.

FIG. 3 is a simplified block diagram of a portion of a scan chain that is susceptible to a second type of scan-chain defect known as polarity reversal, in which a signal of the wrong polarity is applied within a scan chain. The particular situation represented in FIG. 3 is of a scan chain that crosses from one clock domain (Clock1) having a first clock-distribution network 330(1) to a different clock domain (Clock2) having a second clock-distribution network 330(2). In FIG. 3, scan flip-flops 310(1) and 310(2) are in the domain of Clock1, while scan flip-flop 310(3) is in the domain of Clock2.

In order to ensure that the transition from the Clock1 domain to the Clock2 domain functions properly, the scan chain should satisfy the well-known NICE (next instance clocked concurrently or earlier) principle. It is known to configure a lockup latch 340 between the last scan flip-flop 310(2) in the Clock1 domain and the first scan flip-flop 310(3) in the Clock2 domain in order to add a one-half clock cycle delay and satisfy the NICE principle. In the particular implementation of FIG. 3, the lockup latch 340 is a positive-level latch, and the scan chain includes an inverter 350 that ensures that the lockup latch 340 is properly controlled by the level of an inverted version of Clock1. Note that, if lockup latch 340 is a negative-level latch, then inverter 350 is omitted, and the lockup latch 340 is properly controlled by the level of Clock1 itself.

Assume that the scan chain of FIG. 3 is originally designed such that (i) the lockup latch 340 is a positive-level latch and (ii) the scan chain has the inverter 350. If, for some reason, the design is subsequently changed, e.g., during scan synthesis, to use a negative-level latch instead of a positive-level latch for lockup latch 340, then the inverter 350 will need to be removed from the design. Similarly, if the scan chain of FIG. 3 were originally designed such that (i) the lockup latch 340 is a negative-level latch and (ii) the scan chain has no inverter like inverter 350, and then, for some reason, the design is subsequently changed to use a positive-level latch instead of a negative-level latch for lockup latch 340, an inverter like inverter 350 will need to be added to the design. If the particular polarity of the lockup latch 340 does not match the presence/absence of the inverter 350, then a polarity-reversal scan-chain defect will exist, and the scan chain might not operate properly. As such, when the polarity of the lockup latch 340 is changed, the design of the integrated circuit is further modified to accommodate that change, e.g., by removing or adding an inverter. Here, too, such modification may involve making costly and time-consuming mask revisions.

Another situation where a polarity-reversal defect can occur in scan-test circuitry is when a scan-test control signal or other constrained scan-test input signal of the wrong polarity is applied to scan-test control circuitry that controls the scan testing within an integrated circuit.

Figure 4:
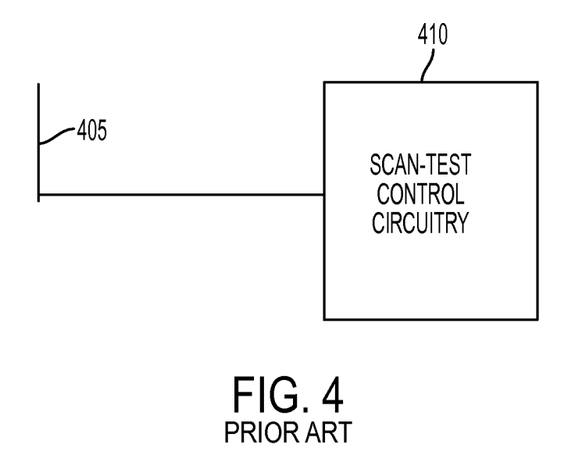
FIG. 4 is a simplified block diagram showing a constrained signal being applied to a block of scan-test control circuitry.

FIG. 4 is a simplified block diagram showing a constrained signal 405 being applied to a block of scan-test control circuitry 410. As used herein, the term "scan-test control circuitry" includes any circuitry that contributes to the control of scan testing. The circuitry that generates the constrained signal 405 is external to the CUST and may be either internal to or external to the integrated circuit that contains the CUST. If, for some reason, the constrained signal 405 has the wrong polarity, then the scan testing of the CUST implemented by the scan-test control circuitry 410 may be improper.

When scan-test defects like the ones described above in the context of FIGS. 2-4 are detected after the integrated circuit mask set has been generated, then the IC mask set is revised in order to correct and/or avoid the scan-test defects. This can significantly increase both the time and cost of designing integrated circuits.

BRIEF DESCRIPTION OF THE DRAWINGS

Embodiments of the invention will become more fully apparent from the following detailed description, the appended claims, and the accompanying drawings in which like reference numerals identify similar or identical elements.

DETAILED DESCRIPTION

Detailed illustrative embodiments of the present invention are disclosed herein. However, specific structural and functional details disclosed herein are merely representative for purposes of describing example embodiments of the present invention. The present invention may be embodied in many alternate forms and should not be construed as limited to only the embodiments set forth herein. Further, the terminology used herein is for the purpose of describing particular embodiments only and is not intended to be limiting of example embodiments of the invention.

As used herein, the singular forms "a," "an," and "the," are intended to include the plural forms as well, unless the context clearly indicates otherwise. It further will be understood that the terms "comprises," "comprising," "includes," and/or "including," specify the presence of stated features, steps, or components, but do not preclude the presence or addition of one or more other features, steps, or components. It also should be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

According to certain embodiments of the invention, an integrated circuit has scan-test circuitry that performs scan testing on circuitry under scan test (CUST) within the integrated circuit, where the scan-test circuitry is susceptible to at least one defect. In order to enable the defect to be corrected after it occurs, the scan-test circuitry includes a set of programmable circuitry connected to provide a signal to other circuitry within the scan-test circuitry, where the set of programmable circuitry includes one or more configurable memory cells connected to control the programming of the set of programmable circuitry. In at least a first state, the one or more configurable memory cells are configured to program the set of programmable circuitry to enable the scan testing to be performed without modification. In at least a second state, the one or more configurable memory cells are configured to program the set of programmable circuitry to modify the scan testing to correct the defect in the scan-test circuitry.

Figure 5:
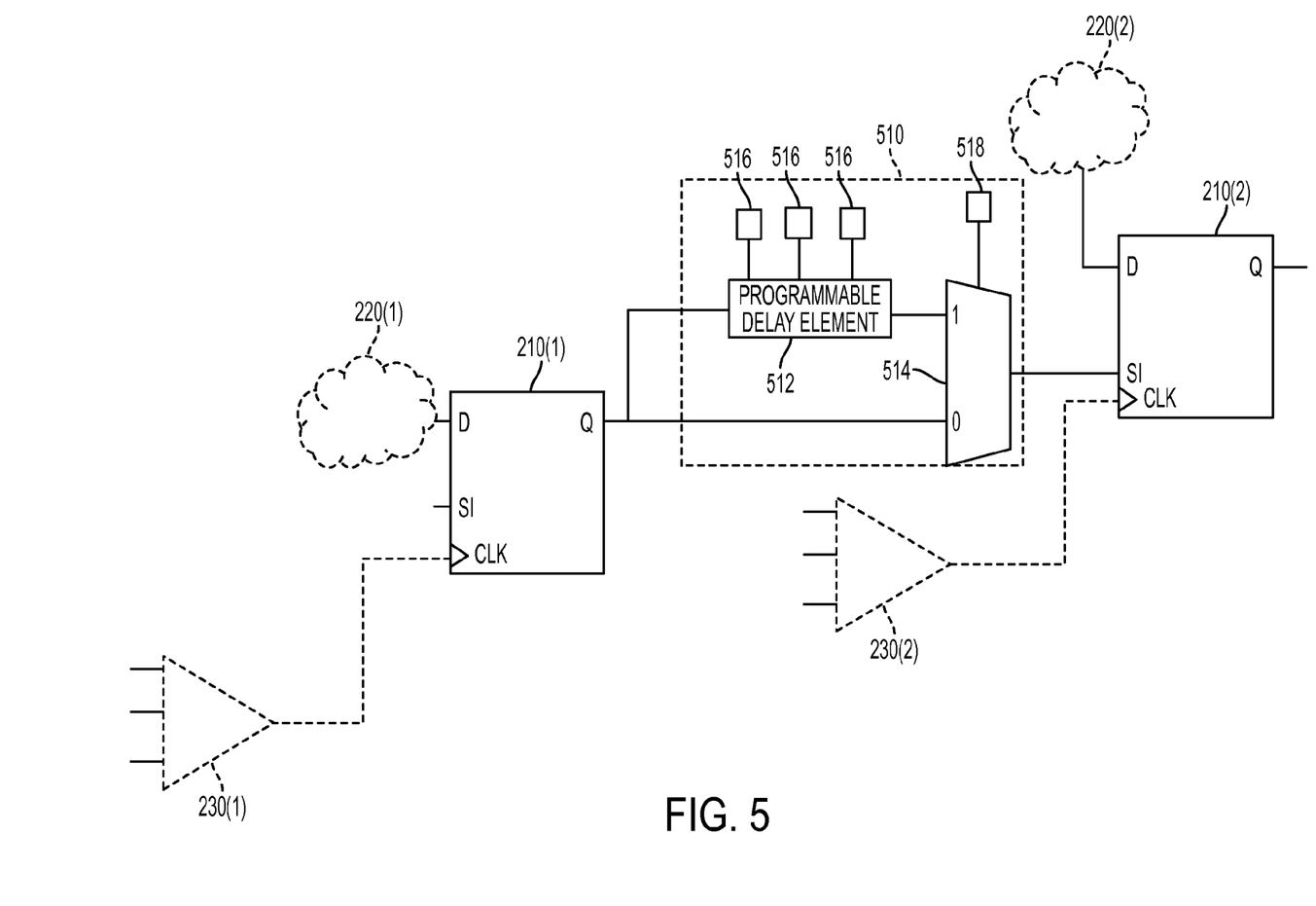
FIG. 5 is a simplified block diagram of a portion of a scan chain according to one embodiment of the present invention that is designed to correct the hold-time violation of FIG. 2.

FIG. 5 is a simplified block diagram of a portion of a scan chain according to one embodiment of the present invention that is designed to correct the hold-time violation of FIG. 2. The scan chain of FIG. 5 includes scan flip-flops 210, functional-logic sets 220, and clock-distribution networks 230 that are analogous to those in FIG. 2. In addition, the scan chain of FIG. 5 includes a set of programmable circuitry 510 having a programmable delay element 512 and a multiplexer 514 and connected between the Q output node of the first scan flip-flop 210(1) and the SI input node of the second scan flip-flop 210(2). The set of programmable circuitry 510 also includes three configurable memory (e.g., SRAM) cells 516 that store configuration bits used to program the programmable delay element 512 and another configurable memory cell 518 that stores a configuration bit used to control the selection by mux 514. The configurable memory cells 516 and 518 may be any suitable type of volatile memory cells, such as (without limitation) static random access memory (SRAM) cells and dynamic random access memory (DRAM) cells, or non-volatile memory cells, such as (without limitation) flash memory, erasable programmable read-only memory (EPROM), electrically erasable PROM (EEPROM), eFUSE, antifuse, magnetic random access memory (MRAM), ferroelectric RAM (FeRAM), spin-transfer torque RAM (STTRAM), and memristor (phase change RAM (PCRAM), resistive RAM (RRAM)) cells.

If it is determined that the clock signal applied to the CLK input node of the first scan flip-flop 210(1) will arrive too early (e.g., before the clock signal is applied to the CLK input node of the second scan flip-flop 210(2)), then (i) the memory cells 516 can be configured to program the delay element 512 to provide an appropriate amount of delay to the Q output signal and (ii) the memory cell 518 can be configured to program mux 514 to select the delayed Q output signal from the delay element 512 at the mux's 1 input node to forward as the SI input signal to the second scan flip-flop 210(2).

In one possible implementation, the programmable delay element 512 supports eight different non-zero amounts of delay corresponding to the eight different combinations of configuration bits stored in the three memory cells 516 from (000) (e.g., for the smallest available amount of delay) to (111) (e.g., for the largest available amount of delay). Other implementations may support other numbers of different delay amounts depending on the number of memory cells 516, which may be less than, equal to, or more than three. In this particular implementation, if no delay needs to be applied to the Q output signal from the first scan flip-flop 210(1), then the memory cell 518 is configured to cause mux 514 to select the undelayed Q output signal applied to the mux's 0 input node to be the SI input signal to the second scan flip-flop 210(2).

By appropriately configuring the memory cells 516 and 518, the set of programmable circuitry 510 can be programmed to correct a hold-time violation from occurring by delaying as necessary the application of the Q output signal from scan flip-flop 210(1) to the SI input node of scan flip-flop 210(2). As such, the programmable delay element 512 and the multiplexer 514 may be considered to be defect-correcting circuitry.

In another embodiment, the programmable delay element 512 can be programmed (e.g., with each memory cell 516 configured to store a "zero" bit) to provide no delay to the Q output signal. In that case, the mux 514 and the memory cell 518 can be omitted.

Although the embodiment of FIG. 5 has the programmable delay applied to the Q output signal from scan flip-flop 210(1) before it is applied to the SI input node of scan flip-flop 210(2), in other embodiments, the programmable delay can be applied at other locations. For example, the programmable delay could be applied to the output of clock-distribution network 230(1) before it is applied to the CLK input node of scan flip-flop 210(1). Alternatively, the programmable delay could be applied to the scan-test clock that is input to clock-distribution network 230(1).

Figure 6:
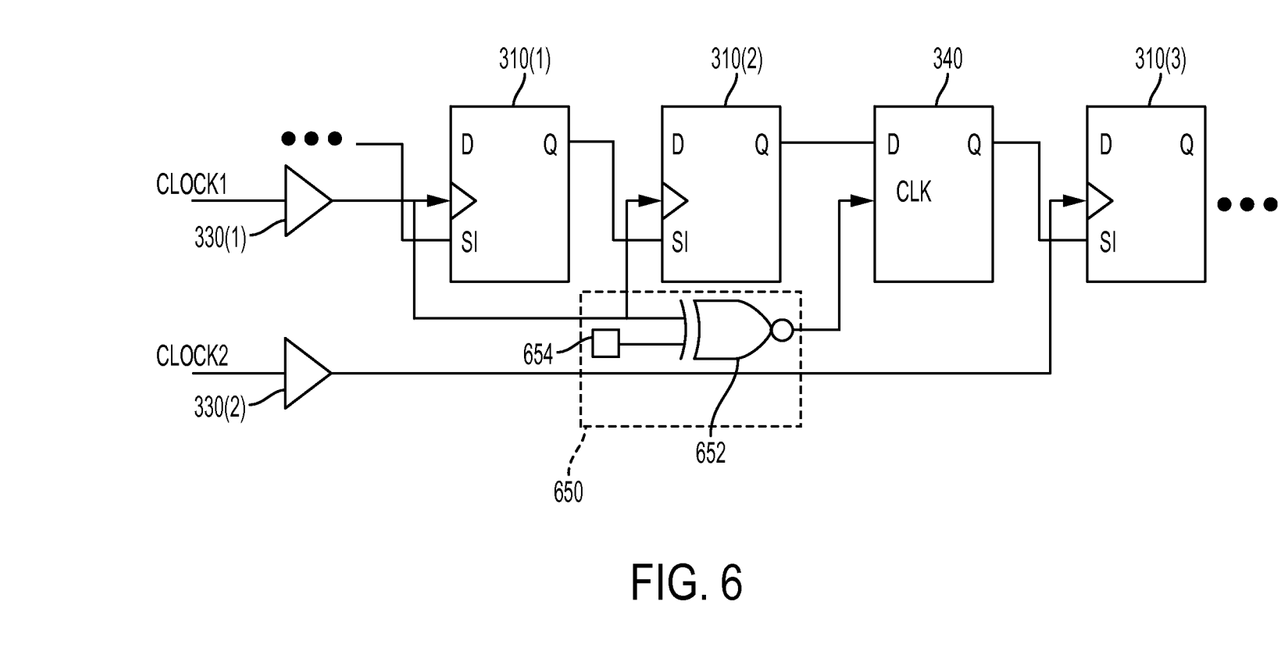
FIG. 6 is a simplified block diagram of a portion of a scan chain according to one embodiment of the present invention that is designed to correct the polarity reversal of FIG. 3.

FIG. 6 is a simplified block diagram of a portion of a scan chain according to one embodiment of the present invention that is designed to correct the polarity reversal of FIG. 3. The scan chain of FIG. 6 includes scan flip-flops 310, lockup latch 340, and clock-distribution networks 330 that are analogous to those in FIG. 3. In addition and instead of inverter 350 of FIG. 3, the scan chain of FIG. 6 includes a set of programmable circuitry 650 having an XNOR logic gate 652 and a configurable memory cell 654. One input node of the XNOR gate 652 is connected to receive the clock signal Clock1, while the other input node of the XNOR gate 652 is connected to receive the configuration bit stored in memory cell 654. The output of the XNOR gate 652 is connected to the clock port of the lockup latch 340.

If the lockup latch 340 is originally designed to be a positive-level latch and if that original design choice does not change, then the memory cell 654 is configured with a "zero" bit. In that case, the XNOR gate 652 functions as an inverter, and an inverted version of Clock1 is applied to the clock port of the lockup latch 340. As such, the scan chain will operate properly, and the scan testing may be said to be performed without modification.

If, however, the lockup latch 340 is originally designed to be a positive-level latch, but, for some reason, the original design is changed such that the lockup latch 340 is implemented with a negative-level latch, then the memory cell 654 is configured with a "one" bit. In that case, the XNOR gate 652 functions as a non-inverting pass gate, and a non-inverted version of Clock1 is applied to the clock port of the lockup latch 340. As such, the scan chain will still operate properly, and the scan testing may be said to be modified to correct the occurrence of a polarity-reversal defect. In this case, the XNOR gate 652 may be considered to be defect-correcting circuitry.

Note that, if, in the original design, the lockup latch 340 is a negative-level latch, then the XNOR gate 652 should be replaced by an XOR gate. In that case, if the original design does not change, then the memory cell is configured with a "zero" bit, the XOR gate will function as a non-inverting pass gate, and a non-inverted version of Clock1 will be applied to the clock port of the lockup latch 340. As such, the scan chain will operate properly, and the scan testing may be said to be performed without modification.

If, however, the lockup latch 340 is originally designed to be a negative-level latch, but, for some reason, the original design is changed such that the lockup latch 340 is implemented with a positive-level latch, then the memory cell 654 is configured with a "one" bit. In that case, the XOR gate functions as an inverter, and an inverted version of Clock1 is applied to the clock port of the lockup latch 340. As such, the scan chain will still operate properly, and the scan testing may be said to be modified to correct the occurrence of a polarity-reversal defect.

Figure 7:
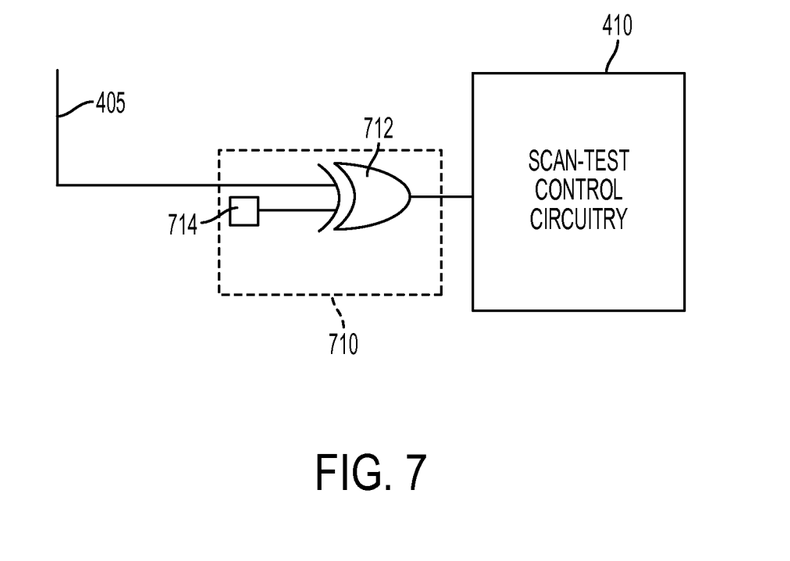
FIG. 7 is a simplified block diagram of a portion of scan-test circuitry according to one embodiment of the present invention that is designed to correct the polarity reversal of FIG. 4.

FIG. 7 is a simplified block diagram of a portion of scan-test circuitry according to one embodiment of the present invention that is designed to correct the polarity reversal of FIG. 4. The scan-test circuitry of FIG. 7 includes the constrained signal 405 and scan-test control circuitry 410 that are analogous to those in FIG. 4. In addition, the scan-test circuitry of FIG. 7 includes a set of programmable circuitry 710 having an XOR logic gate 712 and a configurable memory cell 714. One input node of the XOR gate 712 is connected to receive the constrained signal 405, while the other input node of the XOR gate 712 is connected to receive the configuration bit stored in memory cell 714. The output of the XOR gate 712 is connected to the scan-test control circuitry 410.

If the constrained signal 405 has the expected, proper polarity, then the memory cell 714 is configured with a "zero" bit. In that case, the XOR gate 712 functions as an non-inverting pass gate, and a non-inverted version of constrained signal 405 is applied to the scan-test control circuitry 410. As such, the scan-test circuitry will operate properly, and the scan testing may be said to be performed without modification. In this case, the XOR gate 712 may be considered to be defect-correcting circuitry.

If, for some reason, the constrained signal 405 has the wrong polarity, then the memory cell 714 is configured with a "one" bit. In that case, the XOR gate 712 functions as an inverter, and an inverted version of constrained signal 405 is applied to the scan-test control circuitry 410. As such, the scan-test circuitry will still operate properly, and the scan testing may be said to be modified to correct the occurrence of a polarity-reversal defect.

There are a number of different types of constrained signals that are susceptible to the polarity reversal of FIGS. 4 and 7. These include scan-test control signals or scan-test mode initialization signals that require constraints set on them such as (without limitation):

A scan-test control signal for overriding an internally generated asynchronous reset/set input signal for a scan flip-flop, and replacing it with a dedicated top-level scan reset signal. This scan-test control signal would be applied to the asynchronous set/reset node of one or more scan flip-flops.

A scan-test control signal designed to gate off the primary CUST output(s) so that any external, sensitive circuitry, such as an analog/mixed-signal circuit, would not experience and therefore would not be harmed by the primary CUST output signal(s) toggling at a rapid rate during scan test. This scan-test control signal would be applied to a gate or a set of gates that drive(s) out the primary CUST output signal(s) to such sensitive, external circuit(s).

A scan-test control signal designed to prevent an AC (i.e., toggling) signal from another block affecting the scan-test operation of the CUST. Such scan-test control signals coming from other blocks are to be held to fixed states during scan test and are applied to the Data, Set, or Reset inputs of scan flip-flops, or a combinational logic cone that feeds into those inputs.

A scan-test mode signal that needs to be constrained in a certain manner to allow the correct scan clock(s) to be propagated to the clock inputs of all the scan flip-flops in every scan chain.

The sets of programmable circuitry of FIGS. 5-7 are inserted in the design during logic synthesis and scan insertion, often in an automated manner and prior to place-and-route. For example, after scan synthesis, locations that are susceptible to defects, such as clock-distribution boundaries (as in FIG. 2), lockup latches at clock-domain boundaries (as in FIG. 3), and auxiliary constrained signals (as in FIG. 4), are identified, and appropriate sets of programmable circuitry with their corresponding configurable memory cells are added at those locations before place-and-route is performed. Scan-chain defects can be identified via timing-annotated gate-level simulations. Design changes that occur late in the design cycle (e.g., after place-and-route) or incorrect constraints applied during the logic synthesis phase may require the delay of signals and/or the reversal of the polarity of signals very late in the design cycle. Embodiments of the invention afford a way to avoid having to perform additional, expensive, time-consuming place-and-route and timing-closure iterations.

The invention has been described in the context of particular corrections for particular types of defects in scan-test circuitry, such as programmable delays to correct for hold-time violations and polarity inversions to correct for polarity reversals. In general, programmable delays may be used to correct other types of scan-test defects such as scan chains having fast or slow rise or fall times. Functionally and possibly structurally, a suitable programmable delay may be an (N:1) multiplexer connected to receive N differently delayed versions of a data or clock signal, where the memory-cell-driven mux-select signals are programmed to select one of the N inputs based on the amount of delay needed to correct the corresponding scan-chain defect.

If private bitstream-generation options are used to configure the programmable memory cells to correct scan-circuitry defects, then a high level of security of the scan-test circuitry itself can be achieved, since unauthorized users will be unable to program the scan-test circuitry to perform scan testing properly.

The exemplary embodiments of FIGS. 5-7 employ specific combinations of programmable circuitry to achieve specific results, such as delaying or reversing the polarity of a signal. Those skilled in the art will understand that the invention encompasses other combinations of programmable circuitry that can achieve the same or analogous results.

Integrated circuits have become increasingly complex. Entire systems are constructed from diverse integrated circuit sub-systems. Describing such complex technical subject matter at an appropriate level of detail becomes necessary. In general, a hierarchy of concepts is applied to allow those of ordinary skill to focus on details of the matter being addressed.

Describing portions of a design (e.g., different functional units within an apparatus or system) according to functionality provided by those portions is often an appropriate level of abstraction, since each of these portions may themselves comprise hundreds of thousands, hundreds of millions, or more elements. When addressing some particular feature or implementation of a feature within such portion(s), it may be appropriate to identify substituent functions or otherwise characterize some sub-portion of that portion of the design in more detail, while abstracting other sub-portions or other functions.

A precise logical arrangement of the gates and interconnect (a netlist) implementing a portion of a design (e.g., a functional unit) can be specified. How such logical arrangement is physically realized in a particular chip (how that logic and interconnect is laid out in a particular design) may differ in different process technologies and/or for a variety of other reasons. Circuitry implementing particular functionality may be different in different contexts, and so disclosure of a particular circuit may not be the most helpful disclosure to a person of ordinary skill. Also, many details concerning implementations are often determined using design automation, proceeding from a high-level logical description of the feature or function to be implemented. In various cases, describing portions of an apparatus or system in terms of its functionality conveys structure to a person of ordinary skill in the art. As such, it is often unnecessary and/or unhelpful to provide more detail concerning a portion of a circuit design than to describe its functionality.

Functional modules or units may be composed of circuitry, where such circuitry may be fixed function, configurable under program control or under other configuration information, or some combination thereof. Functional modules themselves thus may be described by the functions that they perform, to helpfully abstract how some of the constituent portions of such functions may be implemented. In some situations, circuitry, units, and/or functional modules may be described partially in functional terms, and partially in structural terms. In some situations, the structural portion of such a description may be described in terms of a configuration applied to circuitry or to functional modules, or both.

Configurable circuitry is effectively circuitry or part of circuitry for each different operation that can be implemented by that circuitry, when configured to perform or otherwise interconnected to perform each different operation. Such configuration may come from or be based on instructions, microcode, one-time programming constructs, embedded memories storing configuration data, and so on. A unit or module for performing a function or functions refers, in some implementations, to a class or group of circuitry that implements the functions or functions attributed to that unit. Identification of circuitry performing one function does not mean that the same circuitry, or a portion thereof, cannot also perform other functions concurrently or serially.

Although circuitry or functional units may typically be implemented by electrical circuitry, and more particularly, by circuitry that primarily relies on transistors fabricated in a semiconductor, the disclosure is to be understood in relation to the technology being disclosed. For example, different physical processes may be used in circuitry implementing aspects of the disclosure, such as optical, nanotubes, micro-electrical mechanical elements, quantum switches or memory storage, magnetoresistive logic elements, and so on. Although a choice of technology used to construct circuitry or functional units according to the technology may change over time, this choice is an implementation decision to be made in accordance with the then-current state of technology.

Embodiments according to the disclosure include non-transitory machine readable media that store configuration data or instructions for causing a machine to execute, or for configuring a machine to execute, or for describing circuitry or machine structures (e.g., layout) that can execute or otherwise perform, a set of actions or accomplish a stated function, according to the disclosure. Such data can be according to hardware description languages, such as HDL or VHDL, in Register Transfer Language (RTL), or layout formats, such as GDSII, for example.

It will be further understood that various changes in the details, materials, and arrangements of the parts which have been described and illustrated in order to explain embodiments of this invention may be made by those skilled in the art without departing from embodiments of the invention encompassed by the following claims.

In this specification including any claims, the term "each" may be used to refer to one or more specified characteristics of a plurality of previously recited elements or steps. When used with the open-ended term "comprising," the recitation of the term "each" does not exclude additional, unrecited elements or steps. Thus, it will be understood that an apparatus may have additional, unrecited elements and a method may have additional, unrecited steps, where the additional, unrecited elements or steps do not have the one or more specified characteristics.

Reference herein to "one embodiment" or "an embodiment" means that a particular feature, structure, or characteristic described in connection with the embodiment can be included in at least one embodiment of the invention. The appearances of the phrase "in one embodiment" in various places in the specification are not necessarily all referring to the same embodiment, nor are separate or alternative embodiments necessarily mutually exclusive of other embodiments. The same applies to the term "implementation."

The use of figure numbers and/or figure reference labels in the claims is intended to identify one or more possible embodiments of the claimed subject matter in order to facilitate the interpretation of the claims. Such use is not to be construed as necessarily limiting the scope of those claims to the embodiments shown in the corresponding figures.

The embodiments covered by the claims in this application are limited to embodiments that (1) are enabled by this specification and (2) correspond to statutory subject matter. Non-enabled embodiments and embodiments that correspond to non-statutory subject matter are explicitly disclaimed even if they fall within the scope of the claims.

What is claimed is:

1. An integrated circuit comprising:
   circuitry under scan test (CUST);
   scan-test circuitry comprising:
   a scan chain of interconnected scan-chain elements, wherein the scan chain supports scan testing of the CUST;
   scan-test control circuitry connected to control operations of the scan chain to perform the scan testing of the CUST; and
   a set of programmable circuitry configured to provide a signal based on configurable data stored in one or more configurable memory cells of the set of programmable circuitry to selectively:
   enable operation of the scan chain in response to a first set of the configurable data to perform scan testing of the CUST without modification, and
   adjust operation of the scan chain in response to a second set of the configurable data to perform modified scan testing of the CUST to correct a defect in the scan test circuitry.

2. The integrated circuit of claim 1, wherein:
   the defect is a hold-time violation; and
   the one or more configurable memory cells are configurable to program the set of programmable circuitry to (i) delay an output signal from a previous scan flip-flop in the scan chain and (ii) selectively apply the delayed output signal to a next scan flip-flop in the scan chain to correct the hold-time violation.

3. The integrated circuit of claim 2, wherein the set of programmable circuitry comprises a programmable delay element configurable to apply a selectable amount of delay to the output signal from the previous scan flip-flop based on one or more configuration bits stored in one or more of the configurable memory cells.

4. The integrated circuit of claim 3, wherein the set of programmable circuitry further comprises a multiplexer connected to receive both of and selectably output one of (i) the delayed output signal from the programmable delay element and (ii) an undelayed version of the output signal from the previous scan flip-flop based on another one of the configurable memory cells.

5. The integrated circuit of claim 3, wherein the programmable delay element is configurable to apply any of a plurality of different amounts of delay to the output signal based on a plurality of configuration bits stored in a plurality of the configurable memory cells.

6. The integrated circuit of claim 1, wherein:
   the defect is a polarity reversal in a clock signal at a boundary between two different clock distribution networks along the scan chain; and
   the one or more configurable memory cells are configurable to program the set of programmable circuitry to selectively reverse the polarity of the clock signal to correct the polarity reversal.

7. The integrated circuit of claim 6, wherein:
   the scan chain comprises a lockup latch at the boundary;
   the polarity reversal results from the lockup latch having a reverse polarity; and
   the set of programmable circuitry comprises a logic gate that selectably inverts the clock signal applied to the lockup latch based on a configuration bit stored in a single configurable memory cell.

8. The integrated circuit of claim 7, wherein:
   the lockup latch having the reverse polarity is a negative-level lockup latch; and
   the logic gate is an XNOR gate.

9. The integrated circuit of claim 7, wherein:
   the lockup latch having the reverse polarity is a positive-level lockup latch; and
   the logic gate is an XOR gate.

10. The integrated circuit of claim 1, wherein:
    the defect is a polarity reversal in a constrained signal generated by another block of circuitry and applied to the scan-test control circuitry; and
    the one or more configurable memory cells are configurable to program the set of programmable circuitry to selectively reverse the polarity of the constrained signal to correct the polarity reversal.

11. The integrated circuit of claim 10, wherein the set of programmable circuitry comprises an XOR gate that selectably inverts the constrained signal based on a configuration bit stored in a single configurable memory cell.

12. The integrated circuit of claim 10, wherein the other block of circuitry that generates the constrained signal is part of the integrated circuit.

13. A method for performing scan testing within an integrated circuit, the method comprising:
    providing scan-test circuitry comprising a scan chain of interconnected scan-chain elements, scan-test control circuitry, and a set of programmable circuitry;
    controlling operations of the scan chain by the scan-test control circuitry;
    accessing configuration data stored in one or more configurable memory cells of the set of programmable circuitry; and
    providing, by the set of programmable circuitry, a signal based on configurable data stored in one or more configurable memory cells of the set of programmable circuitry to selectively:
    enable operation of the scan chain in response to a first set of the configurable data to perform scan testing of circuitry under scan test (CUST) without modification, and
    adjust operation of the scan chain in response to a second set of the configurable data to perform modified scan testing of the CUST to correct a defect in the scan test circuitry.

14. The method of claim 13, wherein:
    the defect is a hold-time violation; and
    the one or more configurable memory cells program the set of programmable circuitry to (i) delay an output signal from a previous scan flip-flop in the scan chain and (ii) selectively apply the delayed output signal to a next scan flip-flop in the scan chain to correct the hold-time violation.

15. The method of claim 13, wherein:
    the defect is a polarity reversal in a clock signal at a boundary between two different clock distribution networks along the scan chain; and
    the one or more configurable memory cells program the set of programmable circuitry to selectively reverse the polarity of the clock signal to correct the polarity reversal.

16. The method of claim 13, wherein:
    the defect is a polarity reversal in a constrained signal generated by an other block of circuitry and applied to the scan-test control circuitry; and the one or more configurable memory cells program the set of programmable circuitry to selectively reverse the polarity of the constrained signal to correct the polarity reversal.

* * * * *